(12) United States Patent
Urard

(10) Patent No.: US 7,127,651 B2
(45) Date of Patent: Oct. 24, 2006

(54) SAMPLING RATE CONVERTER FOR BOTH OVERSAMPLING AND UNDERSAMPLING OPERATION

(75) Inventor: Pascal Urard, Theys (FR)

(73) Assignee: STMicroelectronics S.A., Montrouge (FR)

( * ) Notice: Subject to any disclaimer, the term of this patent is extended or adjusted under 35 U.S.C. 154(b) by 248 days.

(21) Appl. No.: 10/914,306

(22) Filed: Aug. 9, 2004

(65) Prior Publication Data

US 2005/0210350 A1    Sep. 22, 2005

(30) Foreign Application Priority Data

Aug. 11, 2003   (FR)   ................................. 03 09828

(51) Int. Cl.
    *G01R 31/28*    (2006.01)
(52) U.S. Cl. ........................................ 714/724; 341/61
(58) Field of Classification Search ................ 348/708; 375/355; 708/313; 365/185.03; 714/724; 341/61
    See application file for complete search history.

(56) References Cited

U.S. PATENT DOCUMENTS

| | | | |
|---|---|---|---|
| 5,068,716 A * | 11/1991 | Takayama et al. .......... 348/708 |
| 5,204,676 A | 4/1993 | Herrmann | |
| 5,481,267 A * | 1/1996 | Miyabe et al. ................ 341/61 |
| 5,559,513 A * | 9/1996 | Rothermel et al. ........... 341/61 |
| 5,751,615 A | 5/1998 | Brown | |
| 5,818,888 A * | 10/1998 | Holmqvist .................. 375/355 |
| 5,925,093 A * | 7/1999 | Yasuda ....................... 708/313 |
| 6,041,339 A | 3/2000 | Yu | |
| 6,549,456 B1* | 4/2003 | Werner et al. ......... 365/185.03 |
| 6,590,510 B1* | 7/2003 | Woog .......................... 341/61 |
| 7,035,888 B1* | 4/2006 | Lee ............................. 708/313 |

FOREIGN PATENT DOCUMENTS

WO    WO 98/19396    5/1998

OTHER PUBLICATIONS

Preliminary French Search Report, FR 0309828, dated Feb. 27, 2004.

* cited by examiner

*Primary Examiner*—David Ton
(74) *Attorney, Agent, or Firm*—Jenkens & Gilchrist

(57) ABSTRACT

A sampling rate converter includes a chain of identical cells connected in series. An input of a first cell of the chain receives input digital sampling values according to an input frequency. An output of the first cell then delivers output digital sampling values according to an output frequency. The input and output digital sampling values correspond to identical respective reconstruction curves, and the output frequency may be greater than or less than the input frequency. Each cell includes a storage element, two multipliers and two adders.

20 Claims, 7 Drawing Sheets

SAMPLING RATE CONVERTER FOR BOTH OVERSAMPLING AND UNDERSAMPLING OPERATION

PRIORITY CLAIM

The present application claims priority from French Application for Patent No. 03 09828 filed Aug. 11, 2003, the disclosure of which is hereby incorporated by reference.

BACKGROUND OF THE INVENTION

1. Technical Field of the Invention

The present invention relates to a sampling rate converter (SRC) that allows an increase or a decrease in the sampling rate.

2. Description of Related Art

Sampling rate converters are circuits which receive, as input, discrete values according to an input frequency, and which produce, as output, discrete values according to an output frequency, so that the values received and produced correspond respectively to reconstruction curves that are identical. The expression reconstruction curve of a sampled signal is understood to mean the analog signal continuous curve which is obtained by removing the spectral components of the sampled signal that appear at the harmonic frequencies of the sampling frequency. The conversion factor for the sampling rate is the quotient of the output frequency and the input frequency. When this factor is an integer greater than unity, the converter operates as an interpolator: it inserts additional values between the input values. When the conversion factor is an integer less than unity, the converter operates as a decimator: it removes certain of the input values. More generally, a conversion factor of greater than unity corresponds to an oversampling function, and a conversion factor of less than unity corresponds to an undersampling function.

Certain converters operate in digital mode: the input and output values are coded in bits. They may then incorporate, in a known manner, digital hardware such as adders and multipliers.

FIG. 1 is a schematic diagram of a first sampling rate converter of this type, known to the person skilled in the art, which allows an increase in the sampling rate. It comprises a chain of N identical cells connected in series, N being an integer greater than or equal to unity. The $n^{th}$ cell of this chain, denoted Cn, n being an integer lying between 1 and N, possesses a first input IN1(n), a second input IN2(n)) and a third input IN3(n) of respective digital values. It furthermore possesses a first output OUT1(n), a second output OUT2(n), and a third output (OUT3(n)) of digital values. For a cell Cn distinct from the last cell of the chain (n=1, ..., N−1), the outputs OUT1(n) and OUT2(n) of this cell and its input IN3(n) are connected respectively to the inputs IN1(n+1) and IN2(n+1), and to the output OUT3(n+1) of the cell n+1, denoted Cn+1. The output OUT1(N) of the last cell of the chain, that is to say of the cell CN, is connected to the input IN2(N) of the same cell. The input IN1(1) of the cell C1 is intended to receive input sampling values IN, according to an input frequency $f_i$. The input IN3(N) of the last cell of the chain receives a constantly zero value, denoted "0" in FIG. 1. The output OUT3(1) of the cell C1 delivers output sampling values OUT according to an output frequency $f_0$.

Each cell comprises the following hardware:
two multipliers, referenced 13 and 17 for cell C1 in FIG. 1, N3 and N7 for cell CN;
a multiplicative coefficient storage element, referenced 10 for cell C1 and N0 for cell CN;
two adders, referenced 14 and 18 for cell C1, N4 and N8 for cell CN;
two flip-flops, referenced 12 and 16 for cell C1, N2 and N6 for cell CN. The flip-flops are denoted "$Z^{-1}$" in FIG. 1; and
two multiplexers, referenced 11 and 15 for cell C1, N1 and N5 for cell CN.

The hardware items of each cell are connected together in the following manner, described for the cell C1, and corresponding to a so-called "direct" cell structure. First respective inputs of the multipliers 13 and 17 are connected to the storage element 10, and outputs of the multipliers 13 and 17 are connected respectively to first inputs of the two adders 14 and 18. The second input of the adder 14 constitutes the input IN3(1) of the cell C1, the output of the adder 14 is connected to the second input of the adder 18, and the output of the adder 18 constitutes the output OUT3(1) of the cell C1.

The second input of the multiplier 13 is linked to the input IN1(1) by the multiplexer 11 and the flip-flop 12. A first input of the multiplexer 11 constitutes the input IN1(1) of the cell C1, the output of the multiplexer 11 is connected to the input of the flip-flop 12, the output of the flip-flop 12 being connected to the second input of the multiplier 13 and to a second input of the multiplexer 11. The output of the flip-flop 12 furthermore constitutes the output OUT(1) of the cell C1.

The second input of the multiplier 17 is linked in an analogous manner to the input IN2(1) by the multiplexer 15 and the flip-flop 16, the output of the flip-flop 16 also constituting the output OUT2(1).

The multiplexers 11 and 15 furthermore receive on respective control inputs a signal $En_i$ for controlling switching of the flip-flops 12 and 16. The signal $En_i$ regulates the admission of new values IN into the flip-flops 12 and 16. The same control signal $En_i$ is transmitted to the flip-flops of all the cells Cn of the chain corresponding to the flip-flops 12 or 16. It therefore regulates in a synchronized manner the propagation of the values IN throughout the chain. The signal $En_i$ is adjusted in such a way that the output values OUT may be produced substantially at the frequency $f_0$ in a manner compatible with a general gating clock (not represented in FIG. 1) of the converter.

The storage element 10 may be a permanent memory (ROM standing for Read Only Memory), or any other device for generating values, for example based on logic gates. The multiplicative coefficients recorded in the element 10 are, in a manner known to the person skilled in the art, certain values of the response characteristic of a low-pass type filter to an input pulse. Appropriate recording of the coefficients makes it possible to address, respectively to the multipliers 13 and 17, coefficients hi and hi* recorded in the element 10 at addresses that are complementary with respect to the entire set of addresses of the element 10. When the complete chain of cells C1, ..., CN is implemented, an oversampling function is thus obtained between the input IN1(1) and the output OUT3(1), corresponding to a conversion factor of greater than unity.

FIG. 2 is a schematic diagram of a second sampling rate converter, also known to the person skilled in the art, which allows a decrease in the sampling rate. It also comprises a chain of N mutually identical cells, again referenced C1, ..., CN. Each cell comprises the same hardware items as before, but connected differently. The structure of a cell of the converter of FIG. 2 is said to be "transverse," in the jargon of the person skilled in the art.

With reference to the cell C1, and just as for the previous converter, the multipliers 13 and 17 receive, on first respective inputs, the multiplicative coefficients hi and hi* delivered by the storage element 10. They are each connected, by their second respective inputs, to the first input IN1(1) of the cell, and by their respective outputs to the first inputs of the adders 14 and 18.

A second input IN1'(1) of the cell C1 is linked to the second input of the adder 14 by a multiplexer 11' and a flip-flop 12'. The input IN1'(1) is connected directly to the second input of the multiplexer 11', and the output of the adder 14 is linked to the first input of the multiplexer 11'. The output of the multiplexer 11' is connected to the input of the flip-flop 12', and the output of the flip-flop 12' is connected to the second input of the adder 14. The output of the adder 14 moreover constitutes a first output OUT1'(1) of the cell C1 of this converter.

The multiplexer 11' is controlled by a signal $En_0$. The signal $En_0$ triggers the switchings of the flip-flop 12' as well as the updates of the value delivered by the adder 14.

An identical link links a third input IN3(1) of the cell C1 to the second input of the adder 18. This link comprises the multiplexer 15' and the flip-flop 16'. The second input of the multiplexer 15' constitutes the input IN3(1), and the output of the adder 18 constitutes a second output OUT3(1) of the cell C1.

The successive cells of the chain are connected in the following manner: the input IN3(n) and the output OUT1'(n) of a cell n distinct from the last cell of the chain (n=1, ..., N−1) are connected respectively to the output OUT3(n+1) and to the input IN1'(n+1) of the next cell Cn+1. The output OUT1'(N) of the last cell CN is connected to the input IN3(N) of this same cell. Furthermore, a zero value "0" is constantly applied to the input IN1'(1) of the cell C1.

All the cells receive, on their respective inputs IN1(1), ..., IN1(N), the input values IN according to the frequency $f_i$, and all the multiplexers 11', ..., N1' and 15', ..., N5' receive the control signal $En_0$. When the complete chain of cells C1, ..., CN is implemented, a subsampling function is obtained between the input IN1(1) and the output OUT3(1), corresponding to a conversion factor of less than unity. The signal $En_0$ is adjusted so that the output values OUT are produced substantially according to the frequency $f_0$, which is less than $f_1$.

A drawback of the converters described above resides in the fact that each of them possesses either an oversampling function or an undersampling function. A complete sampling rate conversion function, whose conversion factor may be greater than or less than unity, can be obtained only by associating a first and a second converter respectively of the above types. However, such an embodiment requires double the number of certain of the hardware items such as the storage elements, the adders or the multipliers. Now, such hardware items are expensive.

There accordingly exists a need in the art for a single converter which can operate as an oversampler or as an undersampler.

SUMMARY OF THE INVENTION

A sampling rate converter according to the invention comprises a chain of N cells, N being an integer greater than or equal to unity, each cell having a first, a second, a third and a fourth input of digital values, and having a first, a second, a third and a fourth output of digital values. The first and second outputs of a cell other than the last cell of the chain, and the third and fourth inputs of the said cell are connected respectively to the first and second inputs of the next cell along the chain, and to the third and fourth outputs of the said next cell. Furthermore, the first and second outputs of the last cell of the chain are connected respectively to the third and fourth inputs of the said last cell. The first input of the first cell of the chain is intended to receive successive digital input sampling values according to an input frequency, and the second input of the said first cell is intended to receive a zero value. When the chain has been thus supplied with input values, the fourth output of the said first cell delivers successive digital output sampling values according to an output frequency. The input digital sampling values and the output digital sampling values correspond to identical respective reconstruction curves.

Each cell of the converter of the invention comprises two multipliers connected by first respective inputs to an element for storing multiplicative coefficients, and connected by respective outputs of the said multipliers to first inputs of two respective adders. Outputs of the said adders are linked respectively to the second and fourth outputs of the said cell, and second inputs of the said multipliers are linked respectively to the first and third outputs of the said cell.

A converter according to the invention possesses the following two characteristics. Firstly, the second inputs of the two multipliers of each cell are linked respectively to the first and third inputs of the said cell by the first respective pathways each comprising one and the same specified number of first flip-flops connected in series and oriented towards the corresponding multiplier. Secondly, second inputs of the two adders of each cell are linked respectively to the second and fourth inputs of the said cell by second respective pathways each comprising second flip-flops connected in series according to the said specified number and oriented towards the corresponding adder.

Thus, each cell of a converter according to the invention may comprise just a single element for storing multiplicative coefficients, just two multipliers and just two adders, while possessing all the inputs and outputs necessary for operating as an oversampler or undersampler when a complete chain of cells is implemented. A considerable reduction in the size of the converter results therefrom, as well as a reduction in its cost.

The converter may furthermore comprise switching means devised so as to control a transmission of values by the said first or second pathways as a function of a mode selection signal, for an oversampling mode or an undersampling mode respectively. The use of such switching means makes it possible to reduce the number of connections within the converter.

The converter can also comprise a first system for controlling switching of the said first flip-flops, which system is arranged in series with the said first flip-flops. Alternatively, the said first flip-flops can be connected so as to receive through respective control inputs a gated clock signal. An advantage of the use of a gated clock signal is the low energy consumption related to the operation of controlling the flip-flops, relative to the use of a switching control system arranged in series with the flip-flops.

According to a preferred embodiment of the converter of the invention, the storage element of each cell possesses an address input linked to a system for producing addresses through a direct connection and through a connection comprising an inverter. It also possesses a output for multiplicative coefficients which is linked to the first inputs of the two multipliers of the said cell by respective links comprising controlled flip-flops. When the storage element has produced a first multiplicative coefficient stored at a first address and has transmitted this first coefficient to a first of the two multipliers, the storage element thereafter produces a second multiplicative coefficient stored at a second address and transmits this second coefficient to the second of the two multipliers, the said second address being substantially equal to the complementary of the said first address with respect to the number of addresses used of the storage element.

The invention also relates to a sampling process using a sampling rate converter as described above. The conversion factor may possibly be modified during execution of the said process.

BRIEF DESCRIPTION OF THE DRAWINGS

A more complete understanding of the method and apparatus of the present invention may be acquired by reference to the following Detailed Description when taken in conjunction with the accompanying Drawings wherein.

DESCRIPTION OF THE DRAWINGS

In all the figures, identical references designate identical elements or ones having analogous roles within the circuits represented.

Figure 1:
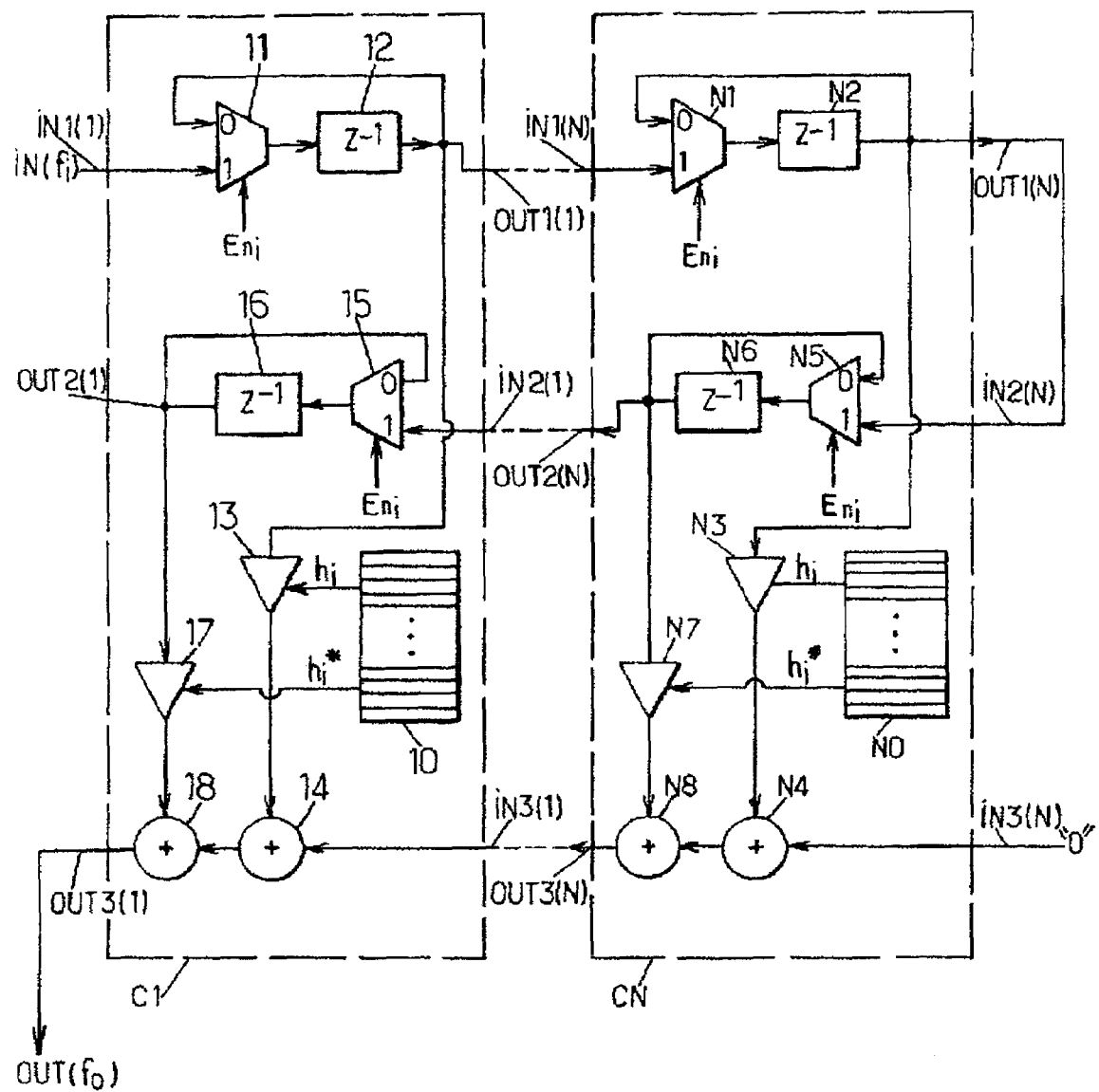
FIG. 1 is a schematic diagram of a sampling rate converter according to the prior art, allowing an increase in the sampling rate.
Figure 2:
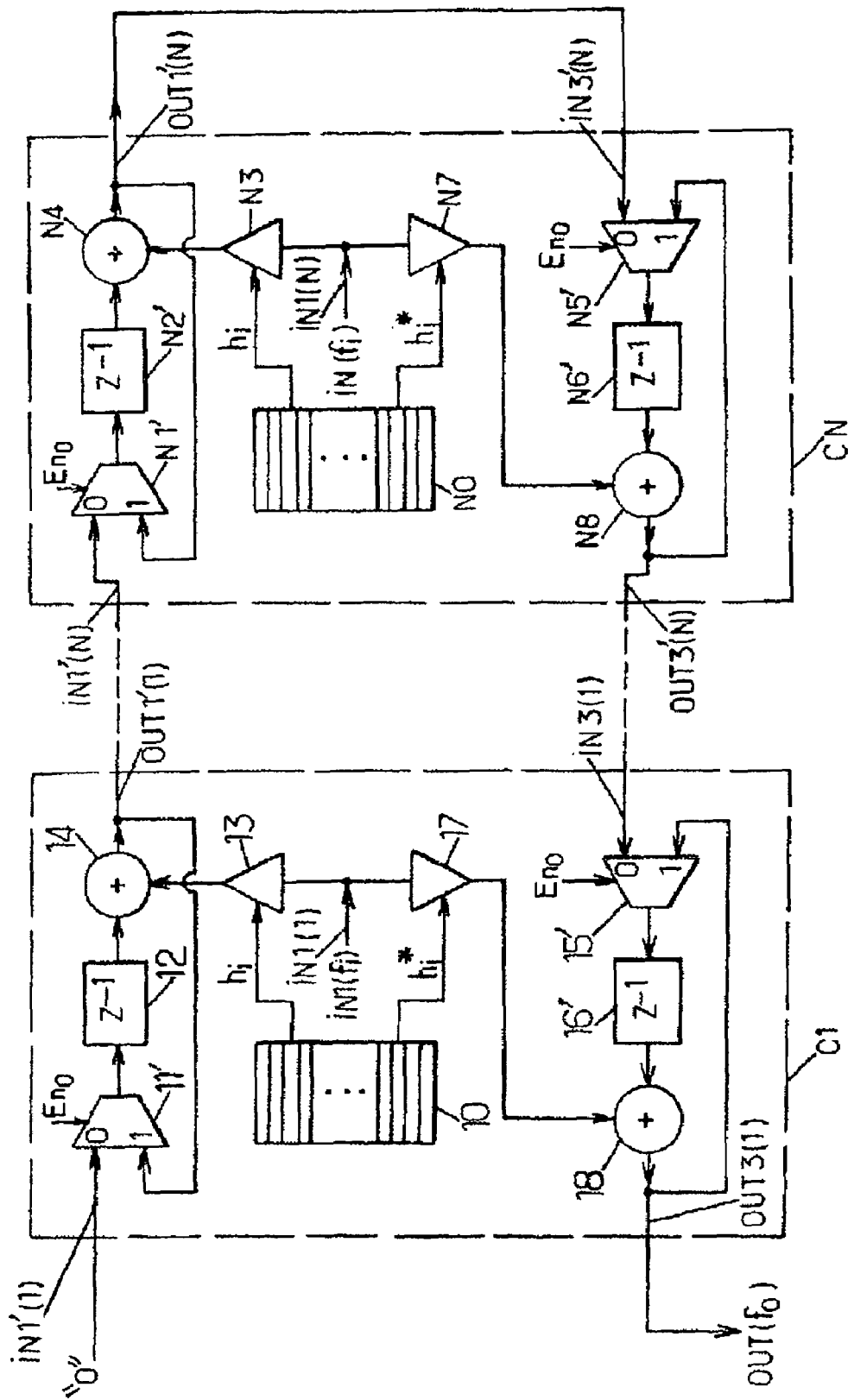
FIG. 2 is a schematic diagram of a sampling rate converter according to the prior art, allowing a decrease in the sampling rate.

FIGS. 1 and 2 relating to existing converters have already been described in detail.

Figure 3:
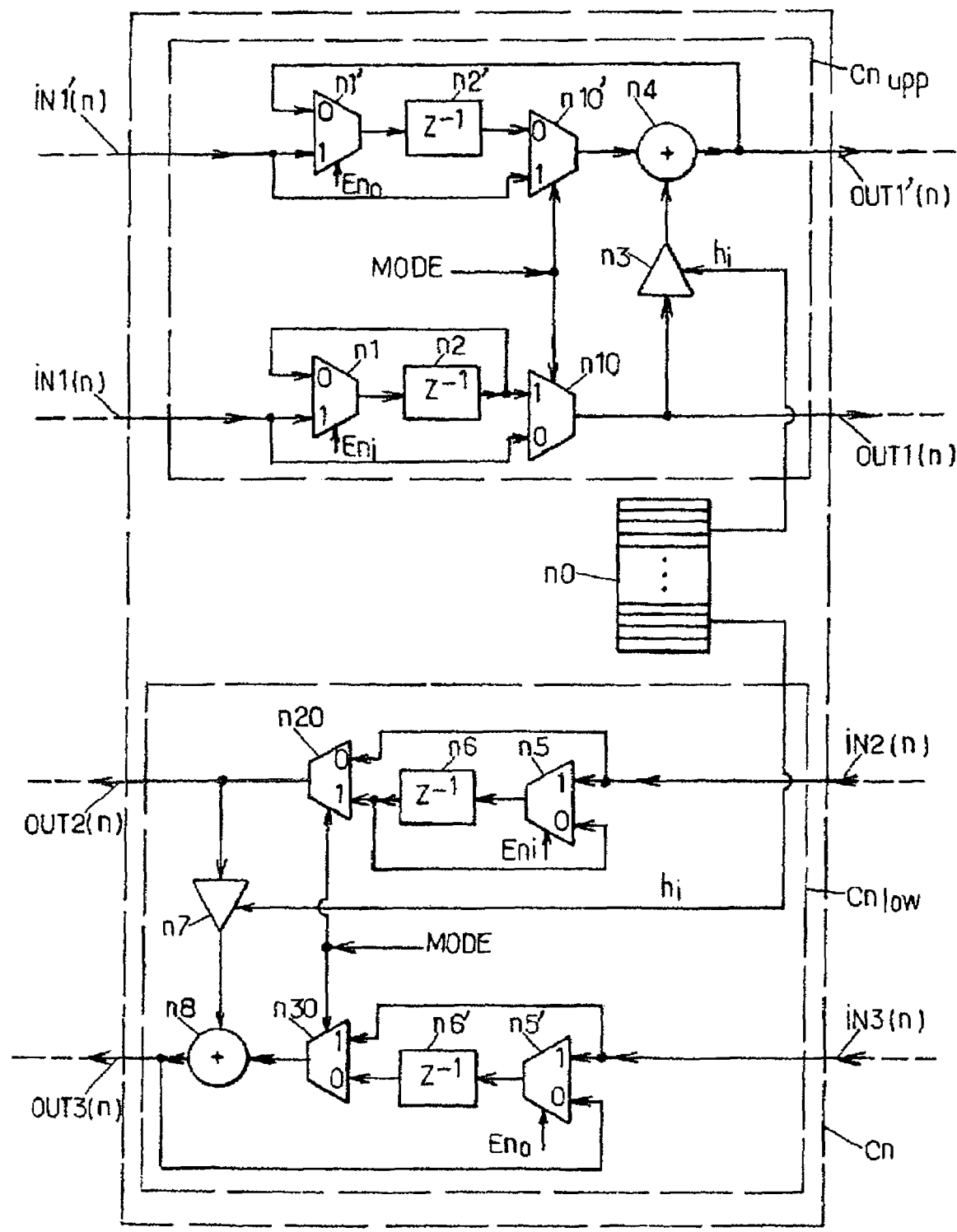
FIG. 3 is a schematic diagram of a cell of a sampling rate converter according to the invention.

In accordance with FIG. 3, a cell Cn, n being an integer, consists of two mutually symmetric half-cells, upper $Cn_{upp}$ and lower $Cn_{low}$, and of a storage element n0 common to the two half-cells.

The storage element n0 carries out a permanent recording of the multiplicative coefficients $h_i$ and $h_i^*$. It may have a relatively low storage capacity, for example of 8 or 16 coefficients. This may be a ROM-type memory. Owing to its low capacity, it may consist alternatively of logic gates devised so as to produce the values of the coefficients.

The upper half-cell $Cn_{upp}$ comprises a first link between an input IN1(n) and an output OUT1(n) of the cell Cn, and a second link between an input IN1'(n) and an output OUT1'(n) of the cell Cn. Each of the two links comprises two pathways for transferring values arranged in parallel and selected by an output multiplexer of the link n10, n10'. To do this, each pathway ends at an input of the multiplexer n10 or n10' of the corresponding link. The two multiplexers n10 and n10' are controlled by one and the same selection signal MODE.

For each link, one of the two pathways is a direct connection between the corresponding input IN1(n) or IN1'(n) of the cell and a first input of the multiplexer n10 or n10'.

The other pathway of the first link comprises a multiplexer n1, a first input of which constitutes the input IN1(n). The output of the multiplexer n1 is connected to the input of a flip-flop n2, the output of the flip-flop n2 being connected to a second input of the multiplexer n10. The output of the flip-flop n2 is furthermore connected to a second input of the multiplexer n1. The multiplexer n1 is controlled by a signal $En_i$ and its output is connected directly to the output OUT1(n) of the cell Cn.

The other pathway of the second link comprises a multiplexer n1', a first input of which constitutes the input IN1'(n) and the output of which is connected to the input of a flip-flop n2'. The output of the flip-flop n2' is connected to a second input of the multiplexer n10'. The output of the multiplexer n10' is connected to a second input of an adder n4, the output of which is connected to the output OUT1'(n). The output of the adder n4 is furthermore connected to a second input of the multiplexer n1'. Finally, the multiplexer n1' is controlled by a signal $En_0$.

The upper half-cell $Cn_{upp}$ furthermore comprises a multiplier n3 whose output is connected to a first input of the adder n4. A first input of the multiplier n3 is linked to an output of the storage element n0, so as to receive values of multiplicative coefficients $h_i$. A second input of the multiplier n3 is connected to the output of the multiplexer n10.

As shown in FIG. 3, the lower half-cell $Cn_{low}$ comprises the multiplexers n5 and n5', the flip-flops n6 and n6', the multiplexers n20 and n30, the multiplier n7 and the adder n8. These elements are devised in the same way as the corresponding elements of the upper half-cell $Cn_{upp}$. The multiplier receives multiplicative coefficients $h_i^*$ originating from the output of the storage element n0. The multiplexers n20 and n30 are also controlled by the signal MODE.

The inputs of the multiplexers n10 and n10' are connected in such a way that, for a first value of the selection signal MODE, for example the binary value 1, the multiplexer n10 reproduces on its output the value received on its second input connected to the flip-flop n2, and so that the multiplexer n10' simultaneously reproduces on its output the value received on its first input connected directly to the input IN1'(n) of the cell. Thus, for the value 1 of the signal MODE, the first link is equivalent to a direct connection between the output of the flip-flop n2 and the second input of the multiplier n3, which also joins the output OUT1(n) of the cell. Simultaneously, the direct connection pathway originating from the input IN1(n) is disabled. Likewise, the multiplexer n10' is then equivalent to a direct connection between the input IN1'(n) and the said second input of the adder n4, the multiplexer n1' and also the flip-flop n2' being disabled.

When the signal MODE possesses the binary value 0, the multiplexer n10 reproduces on its output the value received on its first input connected directly to the input IN1(n) of the cell, and the multiplexer n10' reproduces on its output the value received on its second input connected to the flip-flop n2'. The multiplexer n10 is then equivalent to a continuous connection between the input IN1(n) and the multiplier n3, also joining the output OUT1(n). The multiplexer n1 and the flip-flop n2 are disabled. Likewise, the multiplexer n10' is equivalent to a continuous connection between the flip-flop n2' and the adder n4, the direct connection pathway originating from the input IN1'(n) being disabled.

Within the lower half-cell Cnlow, the multiplexers n20 and n30 are connected in a manner that is symmetrical with respect to the multiplexers n10 and n10', respectively.

When the signal MODE is equal to 1, the cell Cn represented in FIG. 3 is equivalent to a cell as represented in FIG. 1, and when the signal MODE is equal to 0, the same cell Cn is equivalent to a cell as represented in FIG. 2. Consequently, the signal MODE selects oversampling operation (MODE=1), or undersampling operation (MODE=0).

Figure 4:
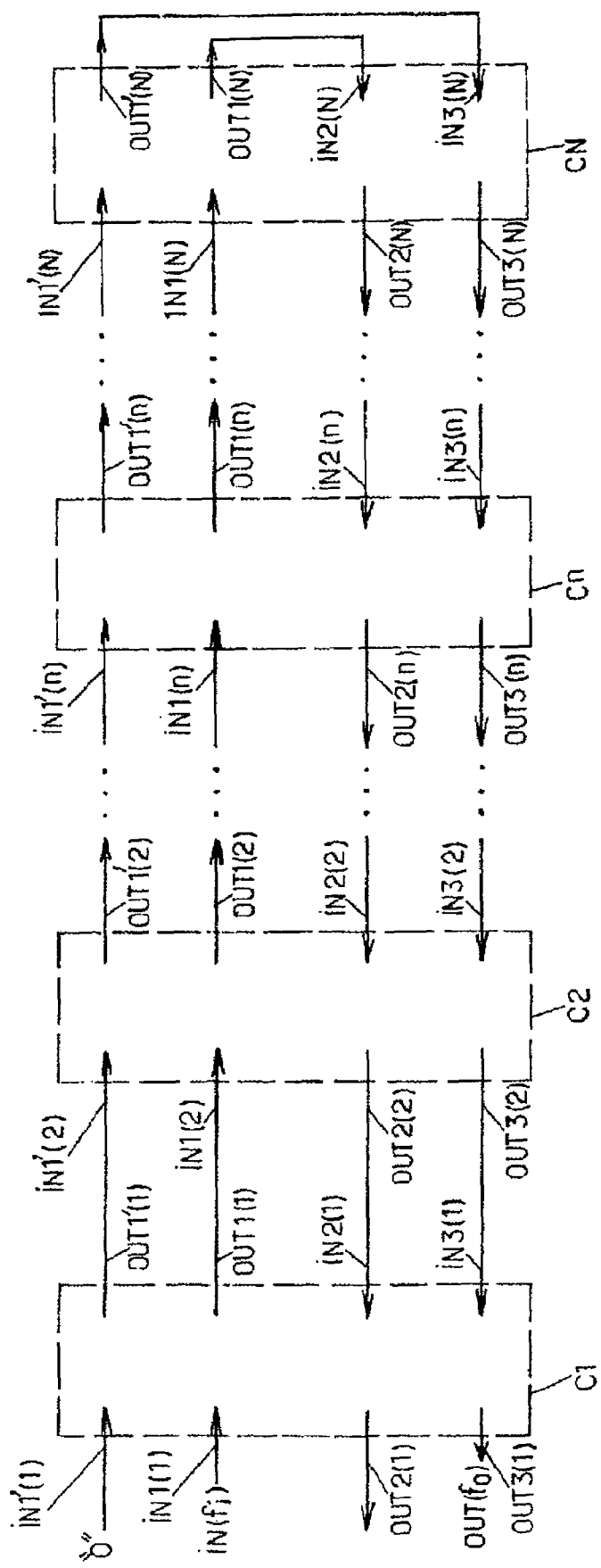
FIG. 4 illustrates the connection between cells according to FIG. 3.

To form the converter, N cells identical to the one described hereinbelow are connected in a chain in accordance with FIG. 4, N being a positive integer. For a cell Cn different from the last cell CN, that is to say n being an integer from among 1, . . . , N–1, the outputs OUT1(n) and OUT1'(n) are connected respectively to the inputs IN1(n+1) and IN1'(n+1) of the next cell Cn+1, and the inputs IN2(n) and IN3(n) are connected respectively to the outputs OUT2(n+1) and OUT3(n+1) of the cell Cn+1. For the cell CN, the outputs OUT1(N) and OUT1'(N) are respectively connected to the inputs IN2(N) and IN3(N). The input IN1(1) of the cell C1 is intended to receive the input sampling values IN according to an input frequency $f_i$. A constantly zero value is applied to the input IN1'(1). The chain being thus supplied with input values, the output OUT3(1) of the cell C1 delivers output sampling values OUT according to a frequency $f_o$, and corresponding to one and the same reconstruction curve as the input values IN.

Figure 5:
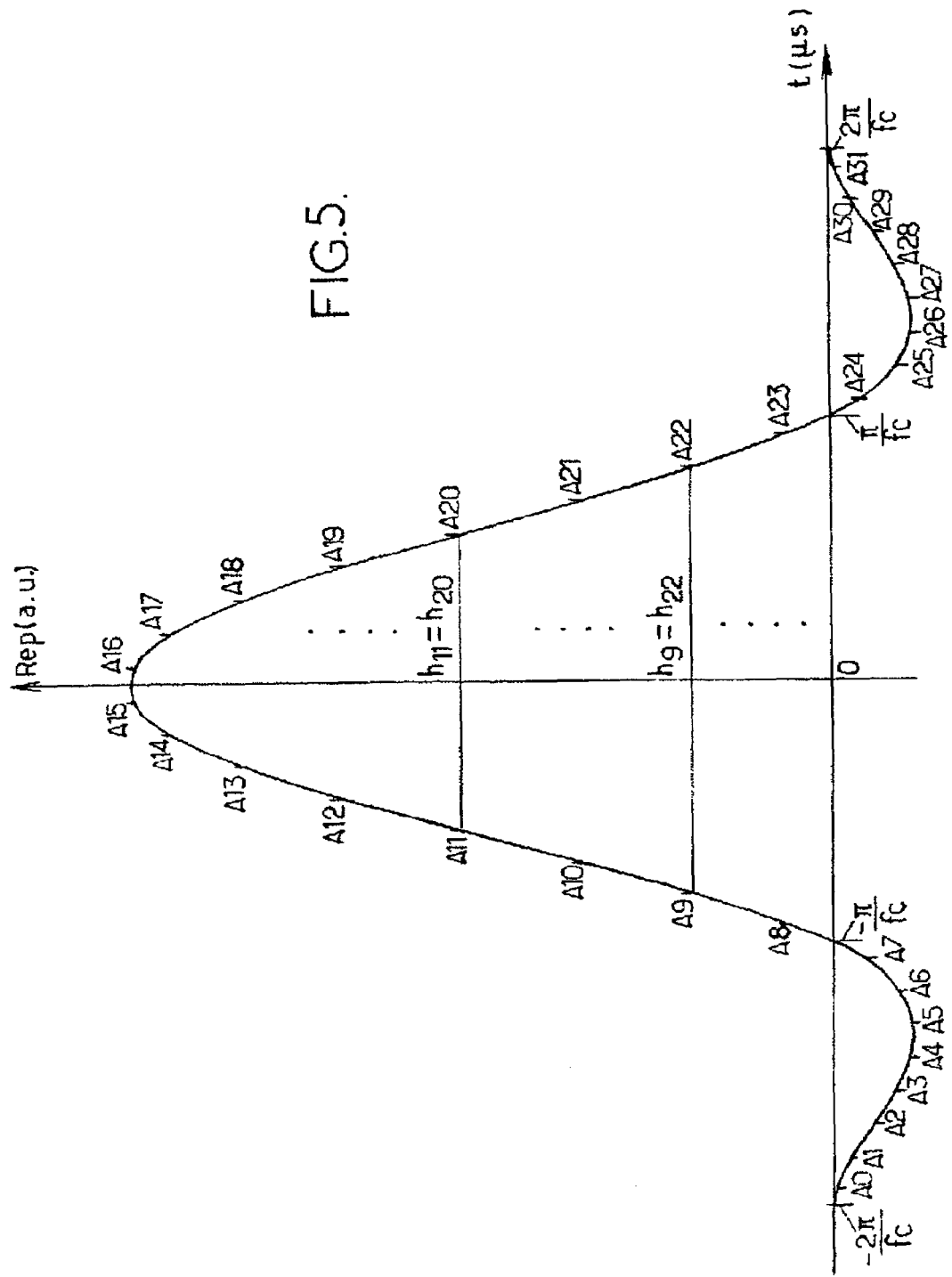
FIG. 5 illustrates a method of determining multiplicative coefficients that are used in a converter according to FIGS. 3 and 4.

The multiplicative coefficients $h_i$ and $h_i^*$ recorded in the storage elements 10, . . . , N0 of a converter according to the invention as described hereinabove may be determined in the same manner as for the converters of FIGS. 1 and 2. FIG. 5 illustrates a method of determining these coefficients. Its represents the characteristic of an impulse response function. The abscissae axis labels a time coordinate t, expressed for example in microseconds (µs). The ordinate axis labels the amplitude Rep of a response to a pulse. It is graduated in arbitrary units (a.u.). The response function may be chosen so as to perform the strictest possible rejection of the frequencies above a specified cutoff frequency $f_c$.

Points A0, . . . , A31 of the characteristic are selected suitably to be the best possible representation of the nonzero values of the impulse response. They are distributed regularly over this characteristic, symmetrically with respect to the origin of the time coordinate. The coefficients $h_i$, i being an integer between 0 and 31, correspond to the respective coordinates of the points A0, . . . , A31.

The values $h_0, \ldots, h_7$ are stored in the storage element 10 of the cell C1, and the values $h_8, \ldots, h_{15}$ are stored in the storage element 20 of the cell C2. In the example considered here, the converter possesses two cells: N=2. In general, 2×N corresponds to the degree of the filtering performed. Storage elements 10, 20 with eight storage locations are used. The coefficients $h_i$ are stored in the elements 10, 20 in ascending order of the addresses of each element and in ascending order of the indices of the coefficients. Thus, for the element 10, h0 will be stored at the address 0, $h_1$ at the address 1, . . . , $h_6$ at the address 6 and $h_7$ at the address 7. For the element 20, $h_8$ will be stored at the address 0, $h_9$ at the address 1, . . . , $h_{14}$ at the address 6 and $h_{15}$ at the address 7. For a given storage element, if $h_i$ is the coefficient stored at a specified address of this element, $h_i^*$ is the coefficient stored at the address equal to the complement with respect to 7 of the address of the coefficient $h_i$. For example, for the element 10, $h_0^*$ is equal to $h_7$, $h_1^*$ is equal to $h_6$, etc. For the element 20, $h_8^*$ is equal to $h_{15}$, $h_9^*$ is equal to $h_{14}$, etc.

The principle set forth in respect of a converter with two cells (N=2) whose storage elements have eight locations associated with addresses coded on three bits, may be carried over to any number N of cells, and to any capacity of the storage elements. While the converter is operating, a given output value OUT produced by the converter results from a combination of the N input values IN which precede or which follow the value OUT considered. Each of these values IN intervenes by being multiplied by coefficients $h_i$ selected as a function of the duration between the value OUT and this value IN.

The minimum structure of a converter according to the invention corresponds to the use of a single cell: N=1. The degree of the associated filtering is then 2.

Figure 6:
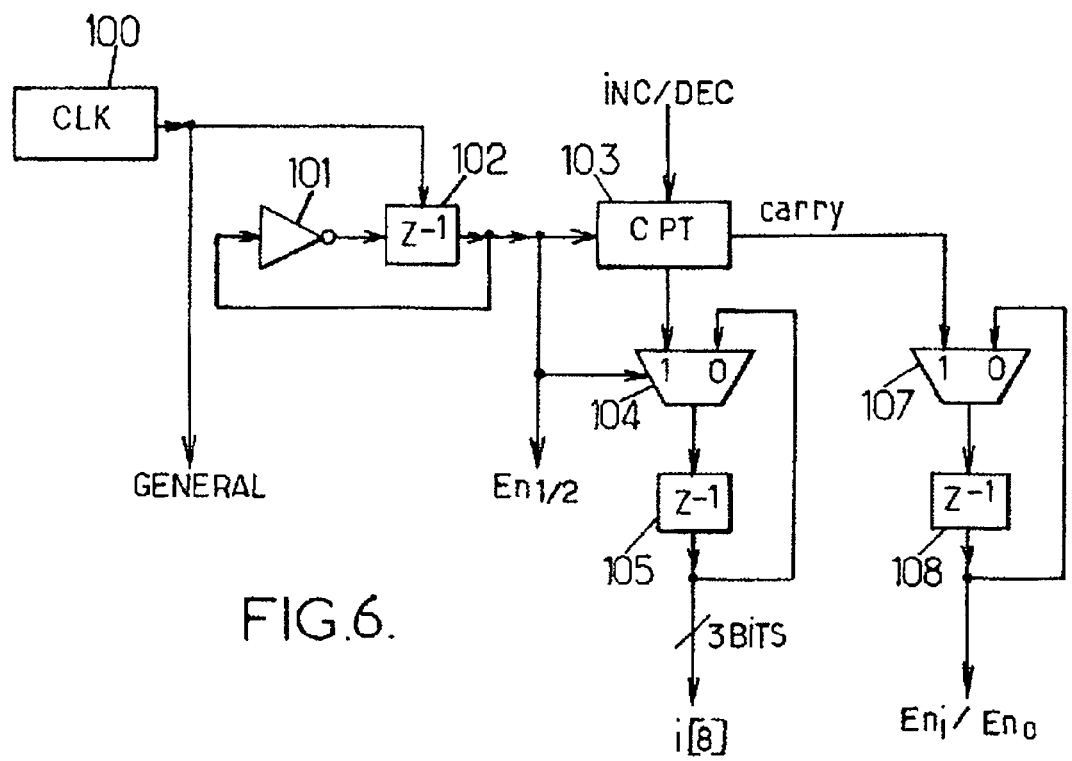
FIG. 6 is a schematic diagram of a controller usable for a converter according to FIGS. 3 and 4.

The control signals $En_i$ and $En_0$, as well as the addresses at which the coefficients $h_i$ are read in the storage elements 10, . . . , N0, are produced by a controller of the converter. FIG. 6 represents a possible embodiment of a controller, suitable for the previous example with two cells (N=2) and eight locations per storage element. The controller comprises a clock 100. In a known manner, the cyclic signal delivered by the clock 100 regulates the general operation of the converter, by way of the output denoted "GENERAL." It controls in particular the switching of an associated flip-flop 102 in a loop with a NOT gate 101. The output signal, denoted $En_{1/2}$, from the flip-flop 102 is cyclic, with a frequency equal to half the frequency of the clock 100.

The signal delivered $En_{1/2}$ is transmitted to a cyclic counter 103, denoted CPT in FIG. 6. The counter 103 is programmable by means of a counting increment, denoted INC. This increment may be positive or negative, in which case it is a decrement DEC. The counting signal produced by the counter 3 is processed by a specific pathway so as to produce the read address for the multiplicative coefficients $h_i$ in the storage elements. This pathway may comprise, for example, a flip-flop 105 whose switching is controlled by a multiplexer 104, gated to the signal $En_{1/2}$. The number of bits on which the counting signal of the counter 103 is coded must be adapted as a function of the number of locations of the storage elements 10, . . . , N0. It must be large enough with respect to this number of locations to make it possible to determine accurately the read address of the multiplicative coefficients at each step of the propagation of the values in the chain of cells. In the example considered, the address must be coded on at least three bits. It is equal to the remainder on dividing the index i of the coefficient $h_i$ by the number of locations of each storage element. Stated otherwise, for the example considered, the address is equal to the index i modulo 8, denoted i[8] in FIG. 6.

Figure 7:
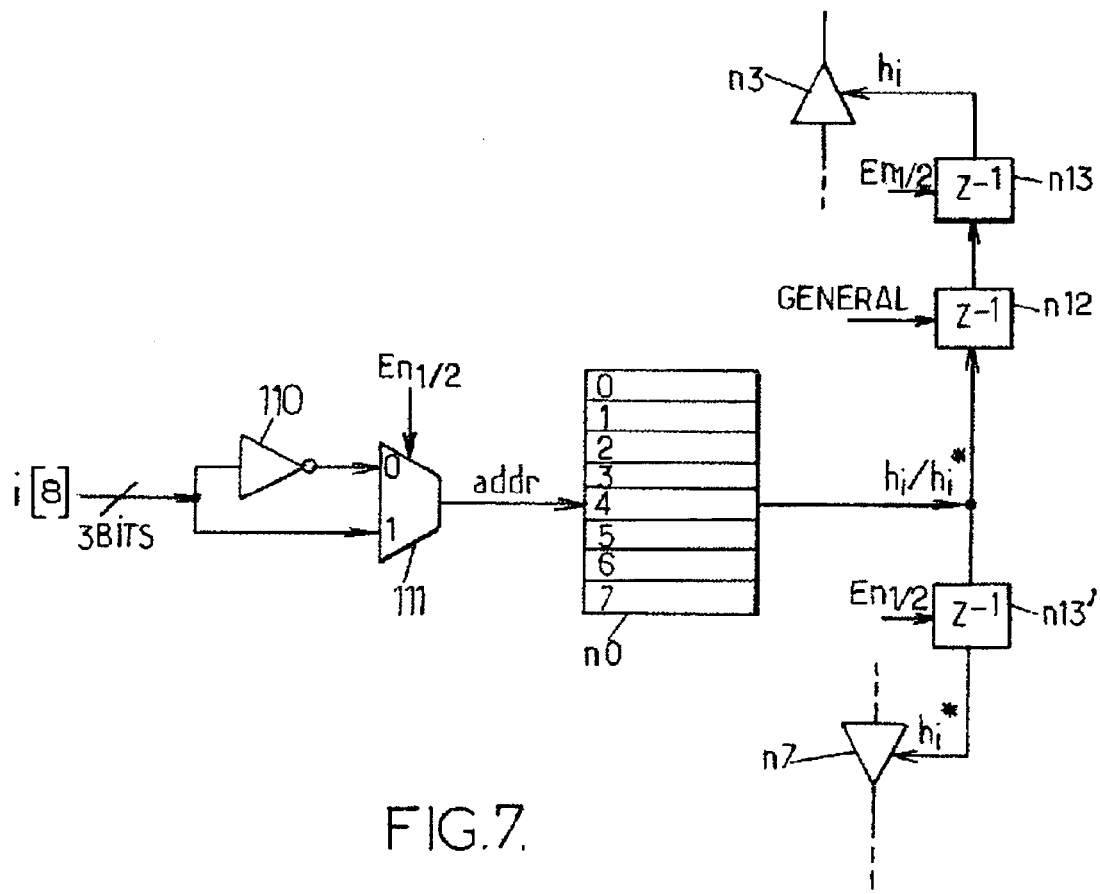
FIG. 7 is a schematic diagram of the connections of a storage element such as is used in a cell according to FIG. 3 and associated with a controller according to FIG. 6.

According to FIG. 7, the address thus obtained is sent to a first input of a multiplexer 111. The complement of this address, delivered by the inverter 110 operating on all the bits of the address bus, is sent to a second input of the same multiplexer. The signal $En_{1/2}$ is transmitted to a control input of the multiplexer 111. Read addresses corresponding to the coefficients $h_i$ or $h_i^*$ are thus transmitted alternately to the storage element n0 of each cell Cn. The element n0 then produces a coefficient $h_i$ or $h_i^*$, respectively transmitted to the multiplier n3 of the upper half-cell $Cn_{upp}$ or to the multiplier n7 of the half-cell $Cn_{low}$. The selection of $h_i$ or $h_i^*$ for each multiplier n3 or n7 is obtained via the flip-flops n12 and n13 arranged between the output of the storage element n0 and the first input of the multiplier n3, and via the flip-flop n13' arranged between the output of the storage element n0 and the first input of the multiplier n7. The switching of the flip-flop n12 is controlled by the clock 100 on the basis of the output of the clock denoted "GENERAL." The switching of the flip-flops n13 and n13' are controlled by the signal $En_{1/2}$.

Returning to FIG. 6, a carry signal produced by the counter 103 is processed simultaneously by another pathway so as to produce the control signals $En_I$ and $En_O$. The carry signal corresponds to an overshoot of the counting signal with respect to the maximum number that can be coded on the three output bits of the counter 103, in the example considered. The pathway for processing the carry signal can comprise a multiplexer 107, gated by the signal produced by the clock 100, which controls the switching of a flip-flop 108.

Figure 8:
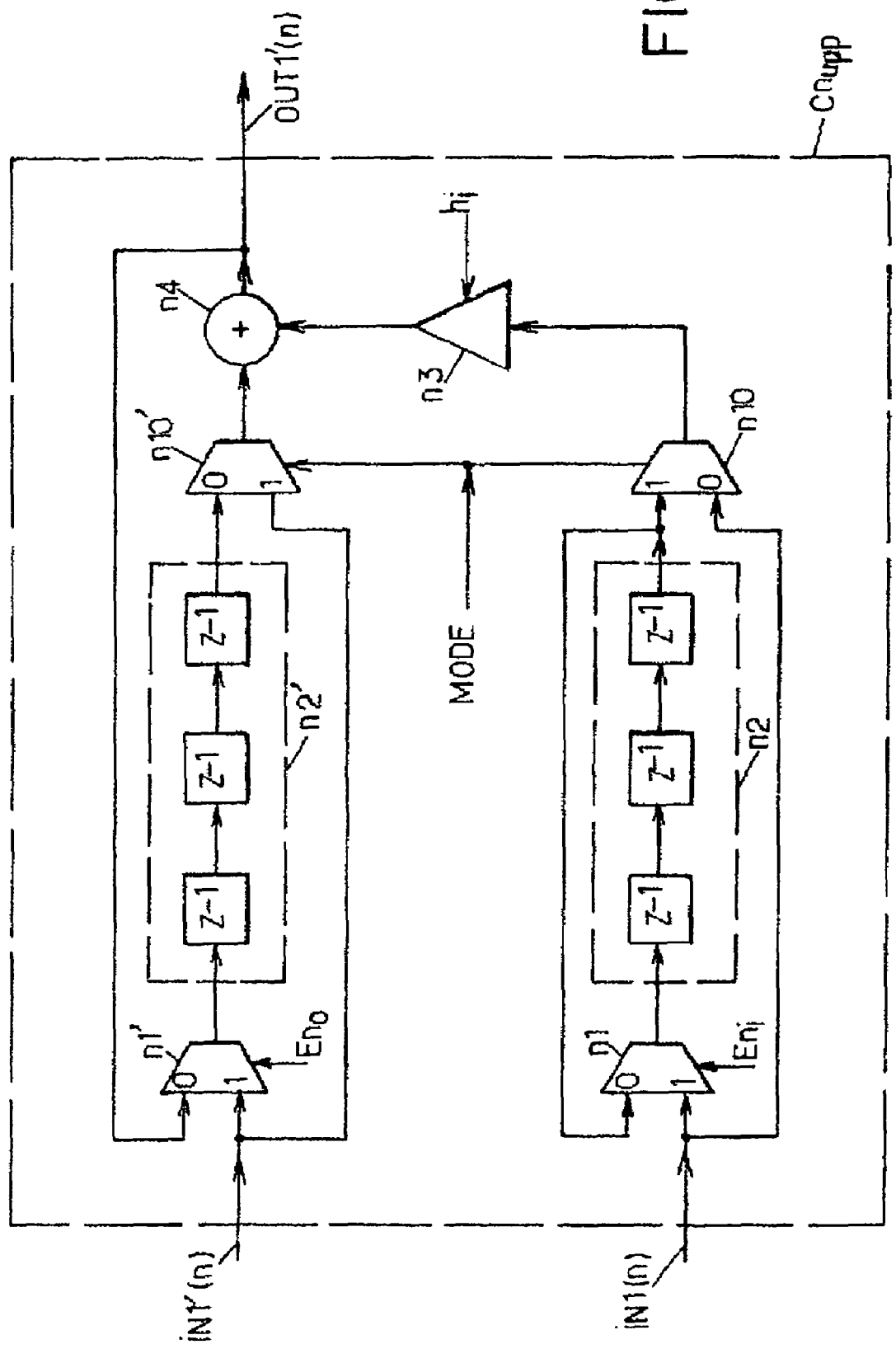
FIG. 8 illustrates a first improvement of a converter according to the invention.

According to a first improvement of the above converter, the flip-flops n2, n2', n6 and n6' are respectively replaced with a same specified number T of flip-flops connected in series. FIG. 8 is a diagram of an upper half-cell $Cn^{upp}$ thus obtained, for example for T equal to 3. The controller of the converter represented in FIG. 6 must then be adapted in such a way that the signal $En_{1/2}$ is replaced by a signal $En_{1/3}$, whose period is equal to three times the duration of a cycle of the clock 100, and equal to 1 during a cycle of the clock 100 over three successive cycles of the latter. Such an adaptation is known to the person skilled in the art. With each alternation of the signal $En_I$ or of the signal $En_O$, the input values are transferred from one flip-flop to the next in each series. The input sampling values IN may then belong cyclically to three distinct sequences. The converter then delivers as output, cyclically for the three sequences, respective interpolated values OUT. One and the same conversion factor is thus applied to the three sequences of values.

According to a second improvement, the multiplexers n1 and n5 may be dispensed with and replaced with the use of a gated clock signal sent to respective control inputs of the flip-flops. One and the same gated clock signal is used for the flip-flops n2 and n6. This signal then regulates the admission and the propagation of the input sampling values IN in the chain of cells during operation as an oversampler.

It is understood that the output OUT1(C1) of a converter according to the invention may be supplemented with the standard functions of rounding, of detection and of processing of overflow, these not being represented in the figures.

A sampling rate converter according to the invention, capable of operating as an oversampler or as an undersampler, may be used in numerous applications. Two particular examples of applications are frequency locked loops and interface systems for transmitting values between entities functioning according to different sampling frequencies.

A particular advantage of the converters according to the invention is the possibility of variation of the conversion factor while sampling values are being processed. A change in the conversion factor has an immediate effect on the output values OUT produced by the converter. This possibility opens up applications for which dynamic adaptation, that is to say performed in real time, of the conversion factor is necessary.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A sampling rate converter comprising:
   a chain of N cells, N being an integer greater than or equal to unity, each cell having a first, a second, a third and a fourth input of digital values, and having a first, a second, a third and a fourth output of digital values;
   the first and second outputs of a cell other than a last cell of the chain, and the third and fourth inputs of the said cell being connected respectively to the first and second inputs of a next cell along the chain, and to the third and fourth outputs of the said next cell, the first and second outputs of the last cell of the chain being connected respectively to the third and fourth inputs of the said last cell, the first input of a first cell of the chain for receiving successive digital input sampling values according to an input frequency, the second input of the said first cell for receiving a zero value, the fourth output of the said first cell then delivering successive digital output sampling values according to an output frequency;
   each cell comprising two multipliers connected by first respective inputs to an element for storing multiplicative coefficients, and connected by respective outputs of the said multipliers to first inputs of two respective adders, outputs of the said adders being linked respectively to the second and fourth outputs of the said cell, and second inputs of the said multipliers being linked respectively to the first and third outputs of the said cell;
   second inputs of the two multipliers of each cell furthermore linked respectively to the first and third inputs of the said cell by first respective pathways each comprising one and the same specified number of first flip-flops connected in series and oriented towards the corresponding multiplier; and
   second inputs of the two adders of each cell linked respectively to the second and fourth inputs of the said cell by second respective pathways each comprising second flip-flops connected in series according to the said specified number and oriented towards the corresponding adder.

2. The converter according to claim 1, further comprising switching means devised so as to control a transmission of values by the said first or second pathways as a function of a mode selection signal to choose an oversampling mode or an undersampling mode, respectively.

3. The converter according to claim 1, further comprising a first system for controlling switching of the said first flip-flops, which system is arranged in series with the said first flip-flops.

4. The converter according to claim 1, wherein the said first flip-flops are connected so as to receive through respective control inputs a gated clock signal.

5. The converter according to any one of claim 1, further comprising a second system for controlling switching of the said second flip-flops, which system is arranged in series with the said second flip-flops.

6. The converter according to claim 1, in which the storage element of each cell possesses:
   an address input linked to a system for producing addresses through a direct connection and through a connection comprising an inverter;
   an output for multiplicative coefficients which is linked to the said first inputs of the two multipliers of the said cell by respective links comprising controlled flip-flops;

and is controlled in such a way that, when the storage element has produced a first multiplicative coefficient stored at a first address and has transmitted the said first multiplicative coefficient to a first of the two multipliers, the storage element thereafter produces a second multiplicative coefficient stored at a second address and transmits the said second multiplicative coefficient to the other of the two multipliers, the said second address being substantially equal to the complementary of the said first address with respect to the number of addresses used of the storage element.

7. A process for sampling digital values using a sampling rate converter according to claim 1.

8. The process of claim 7 in which a conversion factor for the sampling rate of the digital values is modified during execution of the process.

9. A sampling rate converter, comprising:
a cell having first, second, third and fourth inputs and first, second, third and fourth outputs, comprising:
an element storing multiplicative coefficients;
two multipliers connected by first respective inputs to the element and connected by respective outputs to first inputs of two respective adders, outputs of the adders being linked respectively to the first and fourth cell outputs, and second inputs of the said multipliers being linked respectively to the second and third outputs of the said cell, the second inputs of the two multipliers further linked respectively to the second and third inputs of the said cell by first respective pathways each comprising at least one first flip-flop; and
second inputs of the two adders of each cell linked respectively to the first and fourth inputs of the cell by second respective pathways each comprising at least one flip-flop.

10. The converter of claim 9 wherein the first cell output is connected to the fourth cell input and the second cell output is connected to the third cell input, and wherein the second cell input receives an input signal at a first-frequency and the fourth output generates an output signal at a second frequency.

11. The converter of claim 9 wherein each first pathway is switchable between a first and second sub-path and each second pathway is switchable between a third and fourth sub-path.

12. The converter of claim 11 wherein the cell further receives a mode selection signal having one of a first or second state, each first pathway switched to the second sub-path and each second pathway switched to the third sub-path in response to the mode selection signal having the first state and causing the cell to operate in an undersampling mode.

13. The converter of claim 11 wherein the cell further receives a mode selection signal having one of a first or second state, each first pathway switched to the first sub-path and each second pathway switched to the fourth sub-path in response to the mode selection signal having the second state and causing the cell to operate in an oversampling mode.

14. The converter of claim 11 wherein the cell further receives a mode selection signal having one of a first or second state, the cell switching between the first and second sub-paths and between the third and fourth sub-paths in response to the mode selection signal to implement one of an undersampling mode of operation and an oversampling mode of operation.

15. The converter of claim 11 wherein the first and third sub-paths each include at least one flip-flop and the second and fourth sub-paths by-passing signal processing by the included flip-flops.

16. The converter of claim 15 wherein the cell further receives a mode selection signal having one of a first or second state, the cell switching to the first and third sub-paths in response to the mode selection signal having the first state in order to perform an undersampling operation and the cell switching to the second and fourth sub-paths in response to the mode selection signal having the second state in order to perform an oversampling operation.

17. The converter of claim 9 wherein the multiplicative coefficients relate to an impulse response function.

18. A sampling rate converter, comprising:
an input receiving a signal a first frequency;
an output generating a signal at a second frequency;
a mode selection input receiving a mode selection signal;
a plurality of switchable signal processing paths interconnecting the input to the output and including a first selectable signal processing path for implementing an undersampling operation with respect to the received signal and a second signal processing path for implementing an oversampling operation with respect to the received signal; and
a selection circuit responsive to the received mode selection signal to switch received signal processing through the converter to first signal processing path to generate the output signal as an undersampled signal or to the second signal processing path to generate the output signal as an oversampled signal.

19. The converter of claim 18 wherein the plurality of switchable paths and selection circuit are implemented in a single cell.

20. The converter of claim 18 wherein the plurality of switchable paths and selection circuit are implemented in a chain of identical cells connected in series.

* * * * *